United States Patent
Jung et al.

(10) Patent No.: US 7,616,356 B2
(45) Date of Patent: Nov. 10, 2009

(54) IMAGE SENSOR AND METHOD OF MANUFACTURING THEREOF

(75) Inventors: Kyu Dong Jung, Suwon-si (KR); Min Seog Choi, Seoul (KR); Seung Wan Lee, Suwon-si (KR); Woon Bae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 794 days.

(21) Appl. No.: 11/369,728

(22) Filed: Mar. 8, 2006

(65) Prior Publication Data

US 2007/0070448 A1    Mar. 29, 2007

(30) Foreign Application Priority Data

Sep. 15, 2005   (KR) ................... 10-2005-0086426

(51) Int. Cl.
*H04N 1/04* (2006.01)
*H01L 21/00* (2006.01)
*H01L 21/339* (2006.01)

(52) U.S. Cl. .................. 358/482; 257/117; 438/75; 438/144

(58) Field of Classification Search .............. 257/59, 257/72, 117, 118, 140; 438/75, 76, 114, 438/145, 146; 358/474, 475, 482, 483
See application file for complete search history.

(56) References Cited

U.S. PATENT DOCUMENTS

| | | | | |
|---|---|---|---|---|
| 4,692,993 A * | 9/1987 | Clark et al. | ................. | 438/144 |
| 5,992,769 A * | 11/1999 | Wise et al. | ................. | 239/548 |
| 6,573,154 B1 * | 6/2003 | Sridhar et al. | ............... | 438/430 |
| 7,089,798 B2 * | 8/2006 | Silverbrook et al. | ........ | 73/729.2 |
| 7,178,233 B2 * | 2/2007 | Nakamura et al. | ............ | 29/852 |

FOREIGN PATENT DOCUMENTS

KR    2003-0029027 A    4/2003

* cited by examiner

*Primary Examiner*—Jerome Grant, II
(74) *Attorney, Agent, or Firm*—Sughrue Mion, PLLC

(57) ABSTRACT

An image sensor and a method of manufacturing the image sensor, wherein the image sensor can electrically connect a light receiving portion and a printed circuit board (PCB) including circuits by forming holes and filling the holes with a conductive material, without using a wire for the electrical connection between the light receiving portion and the PCB. The light receiving portion converts lights into electrical signals and the PCB electrically processes signals. That is, since a distance for a wire between a sealing structure and because a filter is unnecessary, a thickness may be reduced. Also, since a space for wire bonding is unnecessary on the outside of an image sensor, a fill factor may increase. Also, since a process that may cause contaminates is removed, average yield may increase and production cost may decrease. The manufacturing productivity may be improved.

10 Claims, 5 Drawing Sheets

IMAGE SENSOR AND METHOD OF MANUFACTURING THEREOF

CROSS-REFERENCE TO RELATED APPLICATION

This application claims priority from Korean Patent Application No. 2005-86426, filed on Sep. 15, 2005, in the Korean Intellectual Property Office, the disclosure of which is incorporated herein by reference.

BACKGROUND OF THE INVENTION

1. Field of the Invention

The present invention relates to an image sensor and a method of manufacturing the image sensor. More particularly, the present invention relates to an image sensor which not only can reduce its thickness without exposing a wire connecting the image sensor and a printed circuit board, but also improve average yield and reliability of products, and a method for manufacturing the image sensor.

2. Description of the Related Art

An image sensor is generally a semiconductor device that converts an optical image into an electrical signal. The image sensor is widely being applied in various fields of our lives. The image sensor includes an optical module portion and a circuit portion. The optical module portion generates electric charges as long as light is received. Also, the circuit portion converts the electric charges into an electrical signal. The image sensor may be classified in a charge coupled device (CCD) and a complementary metal-oxide-silicon (CMOS) device according to a method of embodying the image sensor. The CCD stores and transmits an electric charge carrier in a certain capacity while each MOS capacitor is positioned very near to each other. The CMOS device makes as many MOS transistors as the number of pixels by using a CMOS technology and adopts a switching method of detecting outputs in order by using the CMOS technology. In this instance, the CMOS technology uses a control circuit and a signal processing circuit as a peripheral circuit. The driving method of the CCD is complex and consumes a lot of power. Also, since there are many mask process steps, the process becomes complicated. Also, since a signal processing circuit may not be embodied in a CCD chip, there are some disadvantages such as difficulty of manufacturing as one chip. Accordingly, the CMOS device is currently being studied and used in many cases.

Various manufacturing methods have been developed for the image sensor described above. In particular, methods such as chip on board (COB), chip on film (COF), and the like were usually used in a field where miniaturization is important, such as a camera phone and the like. The COB method first attaches a flexible printed circuit board (FPCB) on the back of an image sensor by using die adhesives and later connects a PCB electrode and an input/output terminal (I/O terminal) of the image sensor by using a gold bonding wire. Namely, the COB method adopts a similar process to existing semiconductor production line. Accordingly, the COB method of manufacturing is highly productive. However, since a wire bonding space is needed, the size of a module becomes larger. Also, the COF method directly attaches a flexible PCB on an image sensor, like the COB method. However, an active side of the image sensor is directly flip-chip bonded to an electrode of the flexible PCB. Accordingly, the COF method does not need a gold bonding wire like the COB method. Also, the height of a lens barrel is lowered. Accordingly, a lightweight, thin, short, and small module may be produced.

However, as a package technology was being improved, a chip size package (CSP) technology was also developed. In the CSP, an image sensor is provided on a glass substrate. While the space between an image sensing portion and an upper glass is empty, epoxy resin is adhered around the image sensing portion and the upper glass. Also, electrical wires are formed on the substrate glass from an I/O terminal of the image sensor. Finally, a solder ball is formed.

After this, the package technology was further developed. A new concept of semiconductor package technology assembling the entire wafer at one time appeared from the form of assembling each chip one by one. The new semiconductor package technology simplified its process and considerably reduced package space. This is called as wafer level package (WLP). Unlike an existing method of individually assembling and packaging chips cut from a wafer, this package technology completes assembling on a wafer where chips are not separated. Namely, this package technology incredibly improved a semiconductor process.

Also, one of the main points to be considered in manufacturing an image sensor is that the image sensor increases a fill factor to improve light sensitivity in a light receiving portion. In this instance, the fill factor is a ratio that the light receiving portion occupies on the entire image sensor. However, in the above method, since a circuit portion may basically not be removed, there is a constraint when an area is limited. Accordingly, a condensing technology appeared that changes the path of light entering an area other than the light receiving portion and condenses the light onto the light receiving portion. For this condensing, the image sensor usually uses a method of forming a micro lens on a light receiving diode.

Conventional art will be described in further detail with reference to FIG. 1. FIG. 1 is a cross-sectional view illustrating a configuration of a camera module including a conventional image sensor. As illustrated in FIG. 1, a camera module 1 includes an optical module portion 10 and a circuit portion 20. The optical module portion 10 includes a lens mount 12. A plurality of lenses 11 are laid layer upon layer in the lens mount 12. The lens mount 12 is connected to a filter mount 14 on the back of the lens mount 12. The filter mount 14 supports an infrared filter 13. The infrared filter 13 is combined with the filter mount 14 and seals the space where an image sensor is provided.

The circuit portion 20 includes an image sensor 21 in the filter mount 14. The image sensor 21 is provided on a PCB 22, and a light receiving portion 25 is provided on the image sensor 21. The light receiving portion 25 includes a plurality of light receiving diodes and a micro lens to improve light sensitivity as described above. In this instance, the micro lens is provided on the upper portion of the plurality of light receiving diodes and condenses light. Also, a conductive wire 23 made of aurum or the like is provided on the outside of the image sensor 21 to electrically connect the image sensor 21 and the PCB 22. The light receiving portion 25 and the image sensor 21 are connected to each other by an internal lead line.

However, a camera module constructed above has following problems.

Firstly, a conductive wire made of aurum or the like is used to connect an image sensor and a PCB creating a long electrical access path. This deteriorates some properties of the image sensor. Also, the image sensor and an infrared filter need to be spaced apart from each other by a predetermined distance, so as to ensure the conductive wire does not make contact with other components. Accordingly, a circuit portion may not be manufactured with less than a certain thickness. Also, this is a limiting factor for making a small-sized camera module.

Average yield decreases because of a process of being exposed to contaminates such as dust or the like. The process may include bonding of a conductive wire. A sealing structure of the image sensor is formed between a filter mount and an infrared filter. Accordingly, an additional process is needed to control an occurrence of contaminates. This increases production cost and deteriorates productivity.

Also, since a PCB and an image sensor are connected to each other by wire bonding, a metal pad has to be installed on the image sensor. Accordingly, a fill factor decreases. Also, the connection between the image sensor and the PCB through wire bonding may be damaged because of a thermal condition occurring in other processes or disconnected or creating an open circuit because of an external impact. These problems may decrease the reliability of the image sensor.

Also, one of the most important problems is that application-specific integrated circuit (ASIC) chips such as a Digital Signal Processor (DSP) are increasingly needed when ASIC chips are 3-dimensionally integrated after being vertically provided on an image sensor. In this case, wire bonding complicates the process and enlarges the size of the image sensor.

The above problems are not solved even when an image sensor is manufactured by using a conventional CSP or WLP. Namely, when a conductive wire and a PCB are connected on the outside of an image sensor, the problems described above remain. That is, since each image sensor chip is cut and wire-bonded by using the WLP, the process causes contaminates, such as dust, to flow into the image sensor. Accordingly, the aforementioned problems caused by wire bonding remain. Recently, a WLP method is being widely used. However, without solving the problems as above, the fast development in the field of an image sensor may not be expected because of the decrease of yield, the limits of reducing the thinness of a circuit portion, the difficulty of 3-dimensional assembly, and the like.

SUMMARY OF THE INVENTION

The present invention provides an image sensor which not only can improve average yield, but also decrease production cost and increase productivity by using a wafer level package (WLP) method, and can also remove a conductive wire exposed on the outside of an image sensor chip and can also remove a process that may cause contaminates, and a method of manufacturing the image sensor.

The present invention also provides an image sensor which can reduce a thickness of a camera module by providing an electrical path in an image sensor chip, and a method of manufacturing the image sensor.

The present invention also provides an image sensor in which the image sensor and a printed circuit board (PCB) are internally connected to each other and a plurality of chips can be easily 3-dimensionally assembled, and a method of manufacturing the image sensor.

A method consistent with the present invention relates to a method of manufacturing an image sensor including the steps of: providing a wafer; forming at least one groove on one surface of the wafer; filling the groove with a conductive material; providing a light receiving portion on the one surface, the light receiving portion converting a light into an electrical signal and electrically connected to the conductive material which fills the groove; packing the light receiving portion by providing a glass wafer on an upper portion of the light receiving portion; grinding a surface of the wafer opposite to the surface where the light receiving portion is provided, and exposing the conductive material which fills the groove; patterning a conductive pad on the conductive material exposed on the opposite surface of the wafer and connecting the conductive pad and the conductive material; and cutting the wafer into a unit of chips.

The step of filling the groove with a conductive material may first grow the conductive material on one surface of the wafer where the groove is formed, and later grind and polish the one surface of the wafer, and the step of packing the light receiving portion by providing the glass wafer provides partition walls in the shape of a lattice around the light receiving portion and bond the glass wafer to the partition walls. Also, the step of patterning a conductive pad on the conductive material exposed on the opposite surface of the wafer and connecting the conductive pad and the conductive material includes the steps of: attaching a lower oxide film on the opposite surface of the wafer; exposing the conductive material by patterning and etching the lower oxide film; and contacting the conductive material and the conductive pad. The conductive pad may be provided on a PCB or connected thereto via a wire. Also, the step of forming the at least one groove on the one surface of the wafer may be performed by anisotropic etching, and further include the step of forming an outer oxide film on an outer surface of the wafer after forming the groove.

An image sensor of the present invention includes a wafer having via holes filled with a conductive material and through the wafer; a light receiving portion provided on the upper surface of the wafer, electrically connected to the conductive material and converting an inputted light into an electrical signal; a glass wafer provided on the wafer, sealing the light receiving portion from the outside, and made of a transparent material; and a conductive pad provided on a surface opposite to the surface where the light receiving portion is provided, to contact the conductive material and transmitting an electrical signal. The light receiving portion further includes partition walls, and the partition walls are bonded to the glass wafer. The wafer further includes a lower oxide film on a lower surface of the wafer, and the lower oxide film is patterned and etched to connect the conductive material, which fills the via holes, and the conductive pad.

BRIEF DESCRIPTION OF THE DRAWINGS

The above and/or other aspects and advantages of the present invention will become apparent and more readily appreciated from the following detailed description, taken in conjunction with the accompanying drawings, in which.

DETAILED DESCRIPTION OF ILLUSTRATIVE, NON-LIMITING EMBODIMENTS OF THE INVENTION

Figure 1:
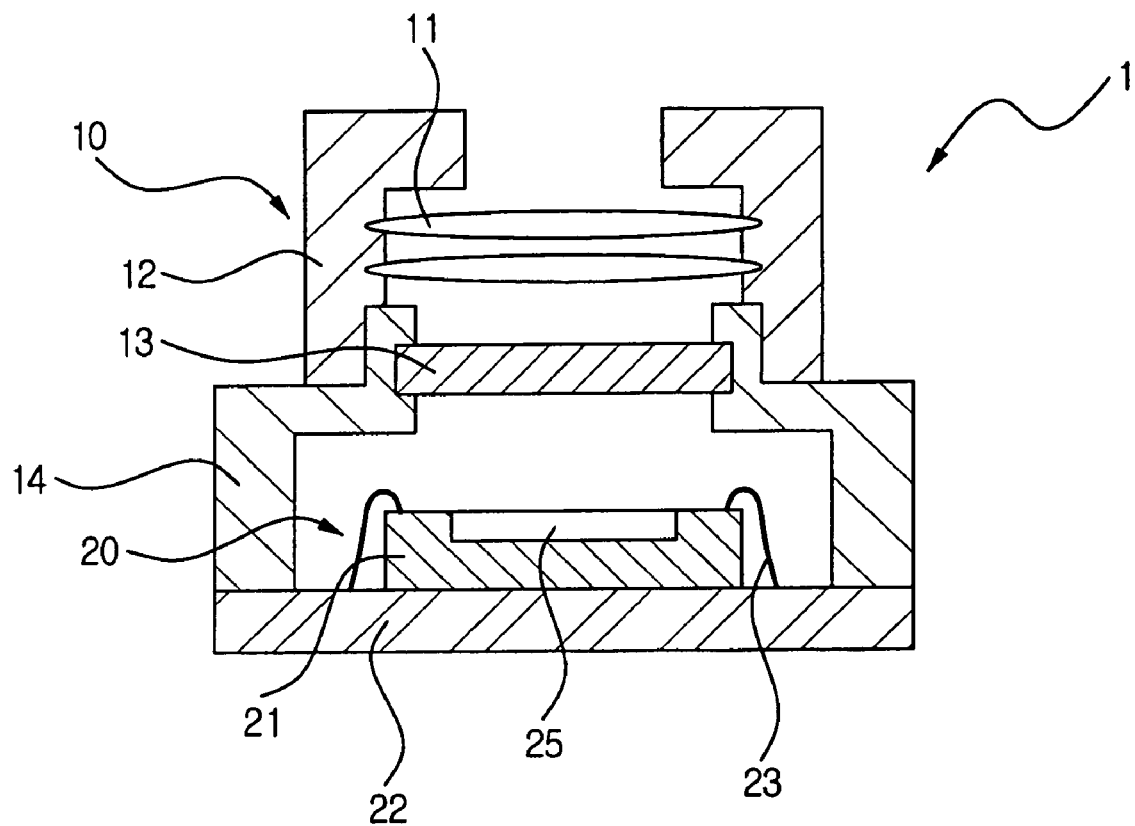
FIG. 1 is a cross-sectional view illustrating a configuration of a camera module including a conventional image sensor.

Reference will now be made in detail to illustrative, non-limiting embodiments of the present invention, examples of which are illustrated in the accompanying drawings, wherein like reference numerals refer to the like elements throughout. The embodiments are described below in order to explain the present invention by referring to the figures.

Figure 2:
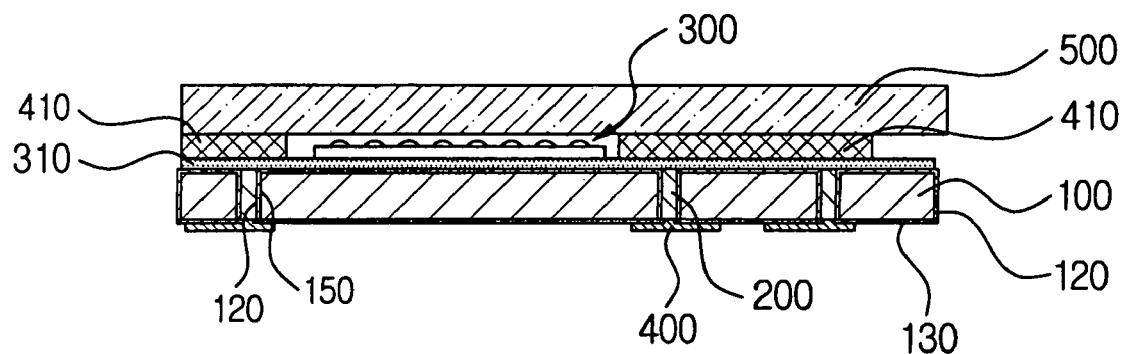
FIG. 2 is a cross-sectional view illustrating a wafer provided to an image sensor before cutting consistent with the present invention.

FIG. 2 is a cross-sectional view illustrating a wafer provided to an image sensor before cutting consistent with the present invention. As illustrated in FIG. 2, an image sensor includes a wafer 100 having via holes 150. An outer oxide film 120 is formed and insulated around the via holes 150. The via holes 150 are filled in with a conductive material 200. A conductive pad 400 makes contact with the conductive material 200 and is electrically connected thereto in a lower portion of the conductive material 200. The conductive pad 400 is mounted on a substrate including all kinds of circuit members processing electrical signals. The substrate is not illustrated. In the case of a conventional wire bonding method, a pad for a wire connecting a PCB and the like is formed on the same surface as a light receiving portion 300. However, in the present invention, the conductive pad 400 is formed on a surface opposite to a surface where the light receiving portion 300 is provided. Accordingly, this reduces the possibility that contaminates, such as dust, may enter during a packaging process. A lower oxide film 130 is formed on a surface opposite to a surface where the light receiving portion 300 is provided. Patterning is performed on a place where the conductive material 200 exists to electrically connect the conductive material 200 which fills the via hole 150 and the conductive pad 400 and to remove the lower oxide film 130.

An oxide layer 310 is formed on an upper surface of the wafer 100. The light receiving portion 300, including light receiving diodes, a micro lens, and the like, is provided on the oxide layer 310. The light receiving portion 300 and the conductive material 200 are electrically connected to each other via an internal lead of the oxide layer 310. The light receiving portion 300 functions to convert lights emitted from the outside into electrical signals. A detailed internal structure thereof is well known in the art. Accordingly, a detailed description thereof will be omitted herein.

Partition walls 410 in the shape of a lattice are provided on both ends of the light receiving portion 300 to embody a sealing structure of the light receiving portion 300. In this instance, the partition wall 410 is made of a polymer such as epoxy and the like. A glass wafer 500 is bonded to the partition walls 410 to seal the light receiving portion 300 from the outside.

The glass wafer 500 and the wafer 100 with the bonded partition walls 410, as described above, are first bonded to each other and cut into a unit of chips, and later used as an image sensor. Detailed operations related thereto will be described below.

When a camera module is directed towards a subject, lights are condensed in the light receiving portion 300 via a transparent material such as an external lens, a filter, and the like. The light receiving portion 300 converts the condensed lights into electrical signals via a light receiving diode. The electrical signals generated in the light receiving portion 300 are transmitted to the conductive pad 400 via the electrical path of the oxide layer 310 and the conductive material 200 which fills the via hole 150. The electrical signals transmitted to the conductive pad 400 are transmitted to other circuit members for their post-processing.

Namely, electrical signals converted from lights are transmitted not by using a wire attached on the outside of a chip, but by using a conductive material which fills a via hole. Accordingly, since a distance for the wire between a sealing structure and a filter is unnecessary, a thickness of an image sensor may be reduced. Also, a space for wire bonding is unnecessary on the outside of the image sensor. Accordingly, a fill factor may increase. Also, 3-dimensional assembly with another substrate, such as a DSP, becomes possible.

Hereinafter, a manufacturing method of the present invention will be described.

Figure 3:
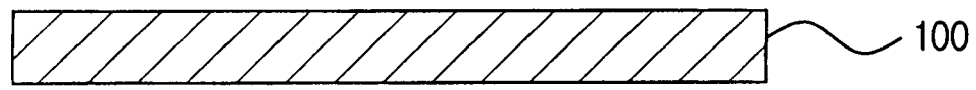
FIG. 3 is a cross-sectional view illustrating a wafer consistent with the present invention.
Figure 4:
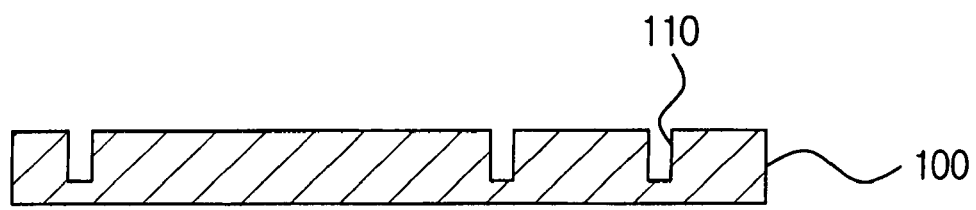
FIG. 4 is a cross-sectional view illustrating a groove formed on a wafer.
Figure 5:
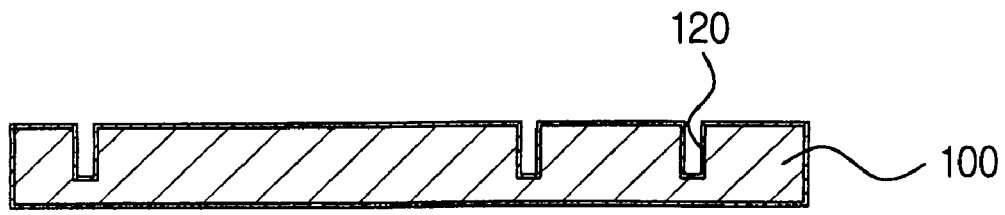
FIG. 5 is a cross-sectional view illustrating an outer oxide film on an outer surface of a wafer.
Figure 6:
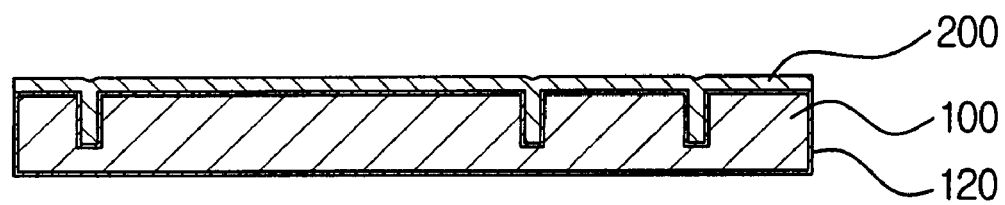
FIG. 6 is a cross-sectional view illustrating a conductive material grown until a groove is filled.
Figure 7:
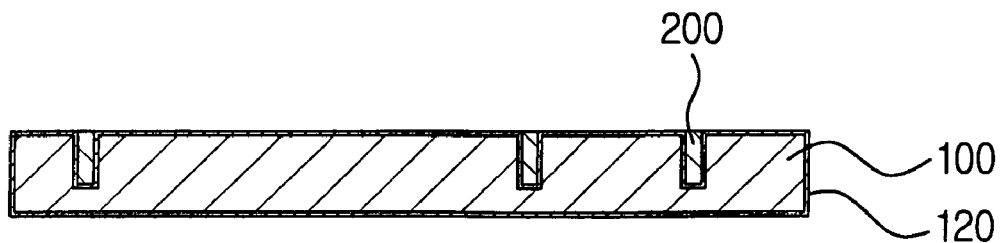
FIG. 7 is a cross-sectional view illustrating an appearance after grinding an upper surface of a wafer.
Figure 8:
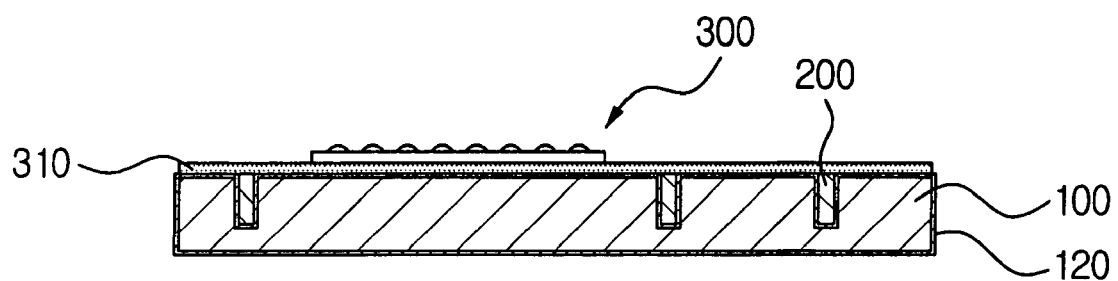
FIG. 8 is a cross-sectional view illustrating a light receiving portion provided on an oxide layer after the oxide layer was formed on an upper surface of a wafer.
Figure 9:
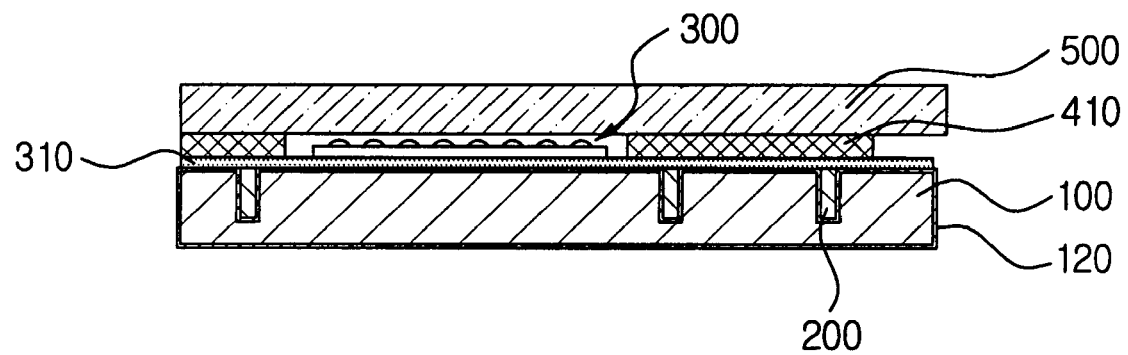
FIG. 9 is a cross-sectional view illustrating a light receiving portion sealed by providing a glass wafer on an upper portion of the light receiving portion.
Figure 10:
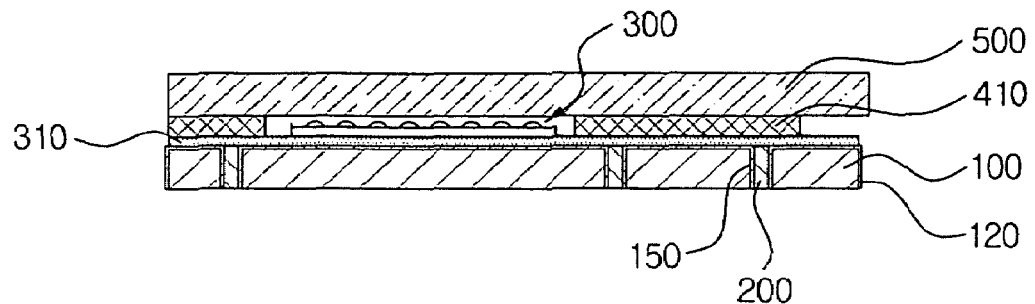
FIG. 10 is a cross-sectional view illustrating a conductive material externally exposed by grinding a lower surface of a wafer.
Figure 11:
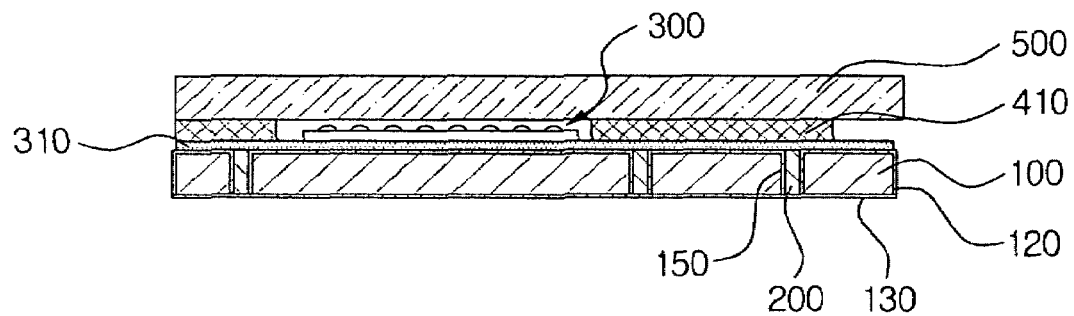
FIG. 11 is a cross-sectional view illustrating a lower oxide film formed on a lower surface of a wafer.
Figure 12:
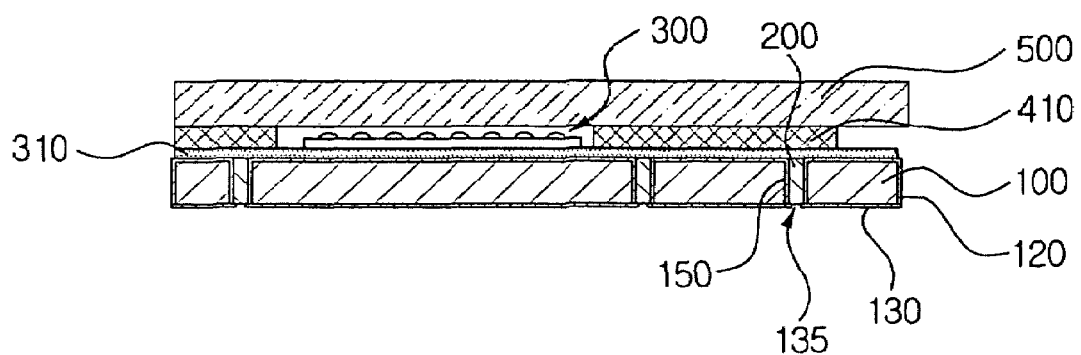
FIG. 12 is a cross-sectional view illustrating a conductive material externally exposed by patterning a lower oxide film.

FIG. 3 is a cross-sectional view illustrating a wafer consistent with the present invention, FIG. 4 is a cross-sectional view illustrating grooves formed on a wafer, FIG. 5 is a cross-sectional view illustrating an outer oxide film on an outer surface of a wafer, FIG. 6 is a cross-sectional view illustrating a conductive material grown until a groove is filled, FIG. 7 is a cross-sectional view illustrating an appearance after cutting an upper surface of a wafer, FIG. 8 is a cross-sectional view illustrating a light receiving portion provided on an oxide layer after the oxide layer has been formed on an upper surface of a wafer, FIG. 9 is a cross-sectional view illustrating a light receiving portion sealed by providing a glass wafer on an upper portion of the light receiving portion, FIG. 10 is a cross-sectional view illustrating a conductive material externally exposed by grinding a lower surface of a wafer, FIG. 11 is a cross-sectional view illustrating a lower oxide film formed on a lower surface of a wafer, and FIG. 12 is a cross-sectional view illustrating a conductive material externally exposed by patterning a lower oxide film.

Initially, as illustrated in FIG. 3, the wafer 100 is provided. The wafer 100 may be a silicon wafer. Also, the size of the wafer 100 may vary, such as 4, 6, 8, and 10 inches. Also, the wafer 100 may be processed to be thinner through a wafer thinning process.

Next, as illustrated in FIG. 4, a plurality of grooves 110 is formed on the wafer 100. Each groove 110 is formed by dry etching, its section is rectangular, and its depth is about 100 to 400 μm.

Next, as illustrated in FIG. 5, the outer oxide film 120 is formed on the outer surface of the wafer 100 having the grooves 110. Through this, the grooves 110 are insulated. After this, as illustrated in FIG. 6, the conductive material 200 is grown on an upper portion of the wafer 100. The conductive material 200 includes polysilicon and the like. Also, a material capable of transmitting electrical signals may be used as the conductive material 200. The conductive material 200 may be grown and formed to fill the grooves 110 insulated by the outer oxide film 120.

Next, as illustrated in FIG. 7, the upper portion of the wafer 100 is ground and polished. In this process, the conductive material 200, except the conductive material 200 which fills the grooves 110, is removed.

Next, as illustrated in FIG. 8, a oxide layer 310 is formed on the upper portion of the wafer 100. The light receiving portion 300 including light receiving diode and a micro lens is then provided on the oxide layer 310. The light receiving portion 300 functions to convert lights emitted from the outside into electrical signals. A detailed process thereof is a well known art. Accordingly, a description thereof will be omitted herein. In the case of the conventional wire bonding method, a pad for a wire connecting a PCB and the like is provided on the same surface as the light receiving portion 300. However, in the present invention, as described later, a pad is formed on a surface opposite to a surface where the light receiving portion 300 is provided. Accordingly, this reduces the possibility that contaminates, such as dust, may flow in during a packaging process.

Next, as illustrated in FIG. 9, partition walls 410 in the shape of a lattice are provided around the light receiving portion 300 to seal the same. Also, the light receiving portion 300 is packed by bonding the glass wafer 500 to the partition walls 410. An anisotropic conductive film (ACF) is used as an adhesive material between the wafer 100 and the glass wafer 500. This process takes about one hour at a temperature of about 180° C. In the case of the conventional method, a pad contacting a wire may be depleted during a process as above. However, in the present invention, a pad contacting a wire is not provided on the same surface as the light receiving portion 300. Accordingly, consistent with the present invention, there is no problem as in the conventional art.

Next, as illustrated in FIG. 10, the surface of the wafer 100 opposite to the surface where the light receiving portion 300 is provided is ground to expose the conductive material 200 which fills the groove to the outside. At this point, the groove is not in the shape of a groove. Namely, the groove is in the shape of a bored hole. Accordingly, in this state, it is referred as the via hole 150.

Next, as illustrated in FIGS. 11 and 12, a lower oxide film 130 is provided on the lower portion of the wafer 100, that is, on the surface of the wafer 100 opposite to the surface where the light receiving portion 300 is provided. After this, the lower oxide film 130 is patterned and etched to expose the conductive material 200 which fills the via hole 150. In this instance, holes 135 are formed on the lower oxide film 130 to expose the conductive material 200.

Next, as illustrated in FIG. 2, the lower oxide film 130 is exposed, and the conductive pad 400 is provided on a place where the conductive material 200 which fills the vial hole 150 is exposed. In this manner, the conductive pad 400 and the conductive material 200 are electrically connected. In this instance, the conductive pad 400 and the conductive material 200 may be connected to another circuit by providing a PCB and a bored pad which are not illustrated, or may be connected via wire bonding. The lower oxide film 130 functions to insulate the other body and the wafer 100.

After the above process, an image sensor chip is completed. Namely, since wire bonding is not exposed to the outside of an image sensor, a thickness of the image sensor may be reduced. Also, since a pad is provided on the opposite surface to the surface where the light receiving portion is provided, it is possible to prevent the depletion of a wire pad in a process for attaching a glass wafer and packaging.

Accordingly, consistent with the present invention, electrical signals converted from light signals are transmitted not by using a wire attached on the outside of a chip, but by using a conductivity material which fills a via hole. Accordingly, since a distance for the wire between a sealing structure and a filter, and the like is unnecessary, a thickness of an image sensor may be reduced.

Also, it is unnecessary to allocate a space for wire bonding on the outside of an image sensor. Accordingly, this may increase a fill factor.

Also, while using a WLP method, a process that may cause contaminates is removed by removing a conductive wire exposed on the outside of an image sensor chip. Accordingly, not to mention an increase of average yield, production cost may decrease. Also, manufacturing productivity may be improved.

Also, since an image sensor and a PCB are internally connected to each other, a plurality of chips may be 3-dimensionally assembled.

Also, since a pad is provided on a surface opposite to the surface where the light receiving portion is provided, depletion of a wire pad may be prevented in a process for attaching a glass wafer and packaging.

While the present invention has been particularly shown and described with reference to exemplary embodiments thereof, it will be understood by those of ordinary skill in the art that various changes in form and details may be made thereto without departing from the spirit and scope of the present invention as defined by the following claims.

What is claimed is:

1. A method of manufacturing an image sensor, comprising the steps of:
   providing a wafer;
   forming at least one groove on one surface of the wafer;
   filling the groove with a conductive material;
   providing a light receiving portion on the one surface, the light receiving portion converting a light into an electrical signal and electrically connected to the conductive material which fills the groove;
   packing the light receiving portion by providing a glass wafer on an upper portion of the light receiving portion;
   grinding a surface of the wafer opposite to the one surface where the light receiving portion is provided, and exposing the conductive material which fills the groove to the outside;
   patterning a conductive pad on the conductive material exposed on the opposite surface of the wafer and electrically connecting the conductive pad and the conductive material; and
   cutting the wafer into a unit of chips.

2. The method of claim 1, wherein the step of filling the groove with a conductive material first grows the conductive material on the one surface of the wafer where the groove is formed, and later grinds and polishes the one surface of the wafer.

3. The method of claim 1, wherein the step of packing the light receiving portion by providing the glass wafer provides partition walls in the shape of a lattice around the light receiving portion and bonds the glass wafer onto the partition walls.

4. The method of claim 1, wherein the step of patterning a conductive pad on the conductive material exposed on the opposite surface of the wafer and connecting the conductive pad and the conductive material comprises the steps of:
   attaching a lower oxide film on the opposite surface of the wafer;
   exposing the conductive material by patterning and etching the lower oxide film; and
   contacting electrically the conductive material and the conductive pad.

5. The method of claim 1, wherein the step of forming the at least one groove on the one surface of the wafer is performed by anisotropic etching.

6. The method of claim 1, wherein the step of forming the at least one groove on the one surface of the wafer further comprises the step of forming an outer oxide film on the opposite surface of the wafer after forming the groove.

7. An image sensor comprising:
- a wafer having via holes filled with a conductive material and penetrating through the wafer;
- a light receiving portion provided on the upper surface of the wafer, electrically connected to the conductive material and converting an inputted light into an electrical signal;
- a glass wafer provided on the wafer, sealing the light receiving portion from the outside, and made of a transparent material; and a conductive pad provided on a surface opposite to the surface where the light receiving portion is provided, to make contact with the conductive material and transmitting an electrical signal.

8. The image sensor of claim 7, wherein the light receiving portion further comprises partition walls in the shape of a lattice, and the partition walls are bonded to the glass wafer.

9. The image sensor of claim 7, wherein the wafer further comprises a lower oxide film on a lower surface of the wafer, and the lower oxide film is patterned and etched to electrically connect the conductive material which fills the via holes and the conductive pad.

10. The image sensor of claim 7, wherein an outer oxide film is formed around the via holes and the via holes are insulated.

* * * * *